(12) United States Patent
Tebrügge et al.

(10) Patent No.: US 11,274,963 B2
(45) Date of Patent: Mar. 15, 2022

(54) MEASURING DEVICE AND METHOD FOR TIME-RESOLVED MEASUREMENT OF A MEASURING SIGNAL

(71) Applicant: KROHNE Messtechnik GmbH, Duisburg (DE)

(72) Inventors: Jan Tebrügge, Dortmund (DE); Jan Förster, Essen (DE); Thomas Fritsch, Neuss (DE)

(73) Assignee: KROHNE MESSTECHNIK GMBH, Duisburg (DE)

( * ) Notice: Subject to any disclaimer, the term of this patent is extended or adjusted under 35 U.S.C. 154(b) by 96 days.

(21) Appl. No.: 16/442,866

(22) Filed: Jun. 17, 2019

(65) Prior Publication Data

US 2019/0383661 A1 Dec. 19, 2019

(30) Foreign Application Priority Data

Jun. 19, 2018 (DE) ...................... 10 2018 114 697.3

(51) Int. Cl.
*G01J 1/44* (2006.01)
*H03K 19/20* (2006.01)
*G01J 1/42* (2006.01)

(52) U.S. Cl.
CPC ............... *G01J 1/44* (2013.01); *H03K 19/20* (2013.01); *G01J 2001/4238* (2013.01); *G01J 2001/442* (2013.01)

(58) Field of Classification Search
CPC .............. G01J 1/44; G01J 2001/4238; G01J 2001/442; G01J 3/44; G01J 2003/4424; H03K 19/20; G01N 21/65; G01N 21/64
See application file for complete search history.

(56) References Cited

U.S. PATENT DOCUMENTS 8,072,595 B1 * 12/2011 Bastiaans ............... G01N 21/65
356/301
9,377,405 B2 6/2016 Mohler et al.
(Continued)

FOREIGN PATENT DOCUMENTS

DE 102008004549 A1 7/2009
DE 102010005723 A1 7/2011
(Continued)

OTHER PUBLICATIONS

Wolfgang Becker, Overview of Photon Counting Techniques, Advanced Time-Correlated Single Photon Counting Techniques, edited by A. W. Castleman, and J. P. Toennies, Springer, 2005. ProQuest EbookCentral, http://ebookcentral.proquestcom/lib/epo-ebooks/detail.action?docID=304331; 16 Pages.
(Continued)

*Primary Examiner* — Thanh Luu
*Assistant Examiner* — Monica T Taba
(74) *Attorney, Agent, or Firm* — David S. Safran; Roberts Calderon Safran & Cole, P.C.

(57) ABSTRACT

A measuring device for time-resolved measurement of a measurement signal and for temporal separation of at least a first portion of the measurement signal, having a light source for emitting a pulsed excitation signal, at least one detector for receiving the measurement signal, the detector generating a detector signal from the measurement signal, at least one first forming unit for generating a first comparison signal, and at least one evaluation unit, the first comparison signal correlating with the excitation signal. At least one first logic function is provided which links at least the first comparison signal with a signal dependent on the detector signal so that the output of the logic function provides a measure of the intensity of the first portion of the measurement signal or of the detector signal. The output of the first (Continued)

logic function is connected to the at least one evaluation unit.

13 Claims, 7 Drawing Sheets

(56) References Cited

U.S. PATENT DOCUMENTS

| | | | |
|---|---|---|---|
| 9,395,247 B2 | 7/2016 | Kostamovaara et al. | |
| 2001/0015411 A1* | 8/2001 | Ohdaira | G02B 21/002 |
| | | | 250/458.1 |
| 2013/0342835 A1 | 12/2013 | Blacksberg | |
| 2014/0231675 A1* | 8/2014 | Mohler | G01J 3/2889 |
| | | | 250/459.1 |

FOREIGN PATENT DOCUMENTS

| | | |
|---|---|---|
| DE | 102011112893 A1 | 3/2013 |
| JP | 2006-201133 A | 8/2006 |
| WO | 2017174337 A1 | 10/2017 |

OTHER PUBLICATIONS

J. Sytsma et al., Time-Gated Fluorescence Lifetime Imaging and Microvolume Spectroscopy Using Two-Photon Excitation, Journal of Microscopy, vol. 191, Pt 1, Jul. 1998, pp. 39-51.

Marco Vitali et al., A Single-Photon Avalanche Camera for Fluorescence Lifetime Imaging Microscopy and Correlation Spectroscopy, IEEE Journal of Selected Topics in Quantum Electronics, vol. 20, No. 6, Nov./Dec. 2014, 10 Pages.

* cited by examiner

MEASURING DEVICE AND METHOD FOR TIME-RESOLVED MEASUREMENT OF A MEASURING SIGNAL

BACKGROUND OF THE INVENTION

Field of the Invention

The invention is based on a measuring device for time-resolved measurement of a measurement signal and for temporal separation of at least a first portion of the measurement signal, having a light source for emitting a pulsed excitation signal, having at least one detector for receiving the measurement signal, wherein the detector generates a detector signal from the measurement signal, having at least one first forming unit for generating a first comparison signal and having at least one evaluation unit.

The excitation signal for excitation of the sample to be examined is an electromagnetic signal within the framework of the present invention. For example, the wavelength of the excitation signal can be in the visible spectral range or in the UV or IR range. The light source is particularly preferably designed as a laser.

The measurement signal is a result of the interaction of the excitation signal with the sample to be examined during operation of the measuring device.

In addition, the invention relates to a method for time-resolved measurement of a measurement signal and for temporal separation of at least a first portion of the measurement signal with a measuring device, wherein the measuring device has a light source for emitting a pulsed excitation signal, wherein the measuring device has at least one detector for receiving the measurement signal, wherein the detector generates a detector signal from the measurement signal, wherein the measuring device has at least one forming unit for generating a comparison signal, and wherein the measuring device has at least one evaluation unit.

Description of Related Art

Measuring devices of the type to which the invention relates are known, e.g., Raman or fluorescence spectrometers.

Raman spectroscopy in particular is an established technology for the qualitative and quantitative spectroscopic determination of substance concentrations in complex mixtures. Often—especially in biological media (fermentations, beer production, milk) or in the presence of dyes (e.g. in soft drinks)—Raman emission is strongly superimposed by fluorescence emission.

In addition to the analysis of Raman scattering, the fluorescence intensity of a sample and its temporal course can also be used for the qualitative and quantitative analysis of, for example, mixtures of substances.

One technique for separating fluorescence emission from Raman emission is time-gated Raman spectroscopy. Here it is made use of that after the excitation of a sample, the Raman emission occurs almost instantaneously, while the fluorescence emission is emitted with a time delay. Various measures can be taken to ensure that the measurement signal can only reach the detector in a short time window or that the detector is only switched on during a short time window. This time window is set so that mainly the Raman signal is detected and the fluorescence signal is suppressed. However, such a wiring of the detector is technically very complex.

A microscope with an evaluation circuit for evaluating the electrical signals of an opto-electrical detector, in particular for recording fluorescence events, and a method for recording fluorescence events is known from European Patent EP 2 761 276 B1 and from corresponding U.S. Pat. No. 9,377,405 B2. The evaluation circuit comprises an analog-to-digital converter (A/D converter) connected to the detector. The evaluation circuit also comprises a shift register, wherein light intensities recorded at different times are stored independently from one another in the stages of the shift register in the form of digital values output by the analog-to-digital converter. A delay unit generates marker values which are temporally assigned to the fluorescence events and which are also stored in the shift register. By linking the marking values and the recorded measurement events, it is ultimately possible to distinguish between Raman and fluorescence events over time.

It is known from U.S. Patent Application Publication 2001/0015411 A1 that, for the temporal separation of measurement signals, the excitation signal, specifically, a laser pulse, is formed and delayed by a forming unit and that an A/D converter arranged behind the detector is connected with the help of this time-delayed signal in such a manner that the A/D converter only digitizes the fluorescence signal to be separated.

In addition, it is known from United Kingdom Patent GB 723240 A and United Kingdom Patent GB 1077501 A that the signals of events occurring one after the other are separated into different channels by a logical link.

SUMMARY OF THE INVENTION

Based on the state of the art described above, it is the object of the invention to provide a measuring device for time-resolved measurement of a measurement signal with which a temporal separation of at least a portion of the measurement signal can be implemented particularly easily. In addition, it is the object of the invention to provide a corresponding method for the time-resolved measurement of a measurement signal.

According to a first teaching of the invention, the above-mentioned object is achieved by a measuring device described in the introduction in that the first comparison signal correlates with the excitation signal, that at least one first logic function is provided, wherein the first logic function, during operation, links at least the first comparison signal and a signal dependent on the detector signal in such a manner that the output of the logic function is a measure for the intensity of the first portion of the measurement signal or of the detector signal, wherein the intensity of a portion of the measurement signal is given by the number of photons that strike the detector during the period of time of the portion of the measurement signal to be separated, and that the outlet of the first logic function is connected to the at least one evaluation unit.

According to the invention, the detector signal has a sequence of at least two, preferably pulse-shaped, portions. These pulse-shaped signal portions are generated by the absorption of a photon in the detector. For example, the first signal portion corresponds to a Raman signal and a second signal portion to a fluorescence signal. The first portion of the measurement signal to be separated is also the first part of the signal in terms of time. According to a further design, the first portion to be separated can also strike the detector after a further signal portion.

It has been recognized that at least one portion of the measurement signal can be separated particularly easily by synchronizing the signal dependent on the detector signal with another signal (comparison signal) and linking it via a logic function linked to a logic device in such a manner that the output of the logic function provides a measure for the intensity of the signal portion to be separated. In this way, complex wiring of the detector can be advantageously avoided.

In the context of the present invention, the intensity of a portion of the measurement signal is given by the number of photons that strike the detector during the time period of the portion of the measurement signal to be separated. Since each photon striking the detector generates a pulse signal, the number of pulse signals of the first portion of the detector signal and thus the number of photons striking the detector during this time can be determined based on the output of the logic function.

The measuring device according to the invention is particularly suitable for measuring the Raman activity of a sample. In detail, the measuring device measures the number of Raman photons striking the detector during operation within a defined time window. The defined time window covers the time range in which one or more Raman photons and fluorescence photons emitted later do not strike the detector simultaneously. In the context of the present invention, a measurement cycle comprises emitting a single excitation pulse and measuring the intensity of the first portion of the measurement signal. If this intensity, i.e., the measured number of photons per measuring cycle, is summed up during a measuring time, wherein the measuring time has a predefinable number of measuring cycles, and if the sum of measured photons is averaged over several measuring times, a statement about the Raman activity of the sample can be made by means of the evaluation unit.

When determining the measurement time, it is preferably assumed that the type and/or properties of the sample do/does not change during a measurement time or during measurement times considered for determining the Raman activity of the sample.

When measuring the Raman activity, the number of Raman photons emitted directly from the sample depends, in particular, on the energy of the pulsed excitation signal.

According to a preferred design, the excitation signal or the comparison signal during operation is designed in such a manner that an intensity of 0 or 1 is measured as expected within a measurement cycle. According to this design, a maximum of one photon typically strikes the detector in the relevant time window.

According to another design, the excitation signal or the comparison signal is designed in such a manner that an intensity greater than 1 can be measured as expected within a measurement cycle. According to this design, typically more than one photon can strike the detector in the relevant time window. This design has the advantage that the measurement time can be shortened and the accuracy of the measurement increased.

According to one design, the signal dependent on the detector signal corresponds to the detector signal. In another design, it is derived from the detector signal, for example, by means of a time delay element and/or by a means for forming the detector signal, in particular for temporal stretching or compression.

The detector is preferably designed in such a manner that it continuously detects and forwards the measurement signal. By continuously recording the measurement signal, not only can the portion to be separated be filtered out of the detector signal, but it is also possible to filter out and evaluate the remaining portions of the measurement signal or the detector signal in order to obtain further information from them. Alternatively, the detector can also be designed in such a manner that it is only active temporarily.

For example, the detector is designed as a multi-pixel photon counter (MPPC). According to the next design, the detector is designed as a photomultiplier, an intensified charge-coupled device (ICCD) or a single photon avalanche diode (SPAD).

According to one design, the correlation between the first comparison signal and the excitation signal consists of deriving the comparison signal from the excitation signal during operation. Preferably at least one second detector is then provided which is designed and arranged in such a manner that the second detector directly detects the excitation signal emitted by the light source, i.e., without prior interaction with the sample to be examined, and forwards it to the forming unit.

According to a further design, the light source has a trigger, wherein the trigger triggers the pulsed excitation signal by means of a trigger signal, and wherein the correlation between the first comparison signal and the excitation signal consists of deriving the comparison signal from the trigger signal. According to this design, the trigger signal is forwarded to the forming unit.

According to a particularly preferred design, the comparison signal has at least one positive signal portion whose amplitude lies within a voltage range that is interpreted as 1 by the logic function.

According to a preferred design, the forming unit has at least one, preferably programmable, delay unit, wherein the delay unit is designed in such a manner that, during operation, the pulsed excitation signal and/or the trigger signal is temporally synchronized by the delay unit with the signal dependent on the detector signal. For this, the excitation signal and/or the trigger signal is/are delayed by a time difference $\Delta t$.

In the context of the present application, synchronization of the comparison signal with the signal dependent on the detector signal is understood to mean, for example, that the positive part of the comparison signal and the first portion of the detector signal are simultaneously present at the logic function. For this, the pulsed excitation signal and/or the trigger signal is/are shifted by a time difference $\Delta t$ by the delay element, wherein the time difference $\Delta t$ corresponds to the time difference between the pulsed excitation signal or the trigger signal and the first portion of the measurement signal. This time difference $\Delta t$ is, for example, in the ps range.

In addition, synchronization of the comparison signal with the signal dependent on the detector signal according to a next design also means that there may be a fixed time difference between the excitation signal or the trigger signal and the first portion of the detector signal.

For example, the positive part of the comparison signal can also be present at the logic function at the same time as at least a second portion of the detector signal. The design of the synchronization depends in particular on the type of logic operation.

If the forming unit has a programmable delay unit, for example, a programmable delay line, with which the delay time $\Delta t$ is specified. Preferably, according to this design, the delay time $\Delta t$ is based on an estimate or on previously determined time differences.

According to a next design, the forming unit has at least one means for generating at least one positive signal for a time period $t_2$ at a time difference of $t_1 \geq 0$ from the excitation signal or the trigger signal. It is particularly preferred that the positive signal is in the form of a simple square-wave signal. Other suitable signal forms are also conceivable.

The at least one positive signal with the duration $t_2$ generates a time window for the separation of the first portion of the detector signal.

Preferably, the duration $t_2$ corresponds essentially to the duration of the first portion of the detector signal or the duration of a second portion of the detector signal.

According to a particularly preferred design, the duration $t_2$ corresponds essentially to the duration of the pulsed excitation signal. This ensures that only Raman photons and no fluorescence photons are measured when measuring the Raman activity of a sample, provided that the duration $t_2$ is sufficiently short.

If the positive signal is generated at a time difference $t_1=0$, this process corresponds to a deformation of the original excitation signal or the original trigger signal. If the positive signal is generated at a time difference $t_1>0$, $t_1$ preferably corresponds to the time difference between the excitation signal or the trigger signal and the first signal portion of the detector signal.

According to a further design, several positive signal portions are generated in the forming unit that follow one another in time. The individual signal portions can have the same duration $t_2$, but they can also have different durations. If, for example, this sequence of positive signal portions is present in the logic function at the same time as the first signal portion to be separated, and if the logic function is designed, for example, as an AND operation, the temporal intensity curve of the first portion of the detector signal can still be evaluated.

According to another preferred design, the forming unit has at least one means for temporal stretching and/or temporal compression of the excitation signal or the trigger signal.

According to a next design, at least one further forming unit is provided, wherein the further forming unit is connected to the output of the detector, wherein the further forming unit preferably has a delay unit, wherein the delay unit synchronizes the detector signal with the comparison signal. For this, the detector signal is delayed by a time interval $\Delta t$.

According to one design, the detector signal is delayed in such a manner that the first portion of the detector signal temporally coincides with the next subsequent excitation signal or trigger signal.

According to one design, two delay units are provided, wherein the delay units are preferably designed as programmable delay lines. According to this design, the forming unit for generating the comparison signal has a delay unit and the further forming unit between the detector output and the logic function also has a delay unit. The presence of two delay units makes it possible to adjust the synchronization of the signals particularly precisely.

According to a further design, a two-channel delay line is provided, wherein the trigger signal or the excitation signal is transmitted to a first input and the detector signal is transmitted to a second input. According to this design, the two forming units are combined to form one device.

According to a further design, the logic function comprises at least an AND operation, an OR operation, an XOR operation, an NAND operation, an NOR operation or an XNOR operation.

If the first comparison signal and the signal dependent on the detector signal are combined by means of an AND operation, the comparison signal is preferably synchronized with the first portion of the measurement signal in such a manner that the at least one positive portion of the comparison signal is present simultaneously with the first portion of the detector signal at the logical AND operation.

According to a next design, at least two identical and/or different logic operations can also be implemented in the at least one logic function.

According to another design, a time-to-digital converter (TDC) is provided for determining the time shift $\Delta t$, in particular between the excitation signal or the trigger signal and the first portion of the detector signal. In an advantageous way, the time shift $\Delta t$ can be empirically determined, thus avoiding estimates with inaccuracies.

According to one design, the TDC measures the time shift between the excitation signal or the trigger signal and a second portion of the detector signal.

According to a next design, the at least one logic function and/or the at least one forming unit is implemented in a microcontroller.

Furthermore, it is advantageous if the at least one logic function is designed as a logic gate.

According to a further design, the logic function is implemented in a multiplexer.

According to the next design of the measuring device, the evaluation unit comprises at least one counter. According to the next design, at least two counters are provided. During operation, the counter counts the number of photons that strike the detector within the relevant time period defined by the synchronization of the comparison signal and the signal dependent on the detector signal.

Preferably, the evaluation unit is designed in such a manner that the at least one counter adds up the number of photons that strike the detector within a measurement time, i.e., during successive measurement cycles. Furthermore, the evaluation unit is preferably designed in such a manner that it carries out a statistical analysis of the number of Raman photons measured during different successive measurement times in order to determine the Raman activity of a sample.

According to a further design, the evaluation unit evaluates further parameters of the pulsed detector signal to determine the number of photons striking the detector. Corresponding parameters are, in particular, the pulse height and/or the pulse area and/or the pulse shape. According to this design, the logic function is preferably implemented in a multiplexer, so that the pulsed detector signal or the pulsed portion of the detector signal to be extracted is transmitted to the evaluation unit.

According to a next configuration, at least one further forming unit is provided for generating a second comparison signal, wherein the second comparison signal correlates with the excitation signal, wherein at least one second logic function is provided, wherein the second logic function combines the second comparison signal and a signal dependent on the detector signal in such a manner that the output of the logic function provides a measure for the intensity of a second portion of the measurement signal, and that the outlet of the second logic function is connected to the at least one evaluation unit. According to this design, a second portion of the measurement signal can be separated in addition to a first portion of the measurement signal, thus providing more information about the sample to be measured.

According to a second teaching of the present invention, the object derived in the introduction is achieved by a method described in the introduction, in that the first comparison signal correlates with the excitation signal, that at least one first logic function is provided, wherein the first logic function combines the first comparison signal and a signal dependent on the detector signal, and that the outlet of the first logic function is connected to the at least one evaluation unit, wherein the method comprises the following steps in one measurement cycle:

emitting a pulsed excitation signal by the light source, interacting of the excitation signal with the sample, detecting and converting the measurement signal into a detector signal by the detector, generating the comparison signal in the forming unit, linking the comparison signal with a signal dependent on the detector signal in the logic function for separating the first portion of the measurement signal and forwarding and evaluating by the evaluation unit of the output of the logic function, wherein the evaluation comprises determining the number of photons that strike the detector during the period of time of the portion of the measurement signal to be separated.

The output of the logic function thereby corresponds to a measure for the intensity of the first portion of the measurement signal.

According to a preferred design, the method comprises several measurement cycles that are completed within one measurement time, wherein the evaluation unit sums the intensities measured per measurement cycle to a total number of photons that strike the detector during the measurement time.

Preferably, the method for determining the Raman activity further comprises several measurement times, wherein, according to one design, a statistical analysis of the total numbers measured per measurement time is carried out by the evaluation unit, wherein in particular the mean value is determined over the total numbers measured per measurement time.

The method according to the invention has one of the above-described measuring devices. In respect to the individual designs of the method and their advantages, reference is made to the description of the corresponding designs of the measuring device.

In detail, there is a plurality of possibilities for designing and further developing the measuring device according to the invention and the method according to the invention as will become apparent from the following description of preferred embodiments with reference to the accompanying drawings.

DETAILED DESCRIPTION OF THE INVENTION

Figure 1:
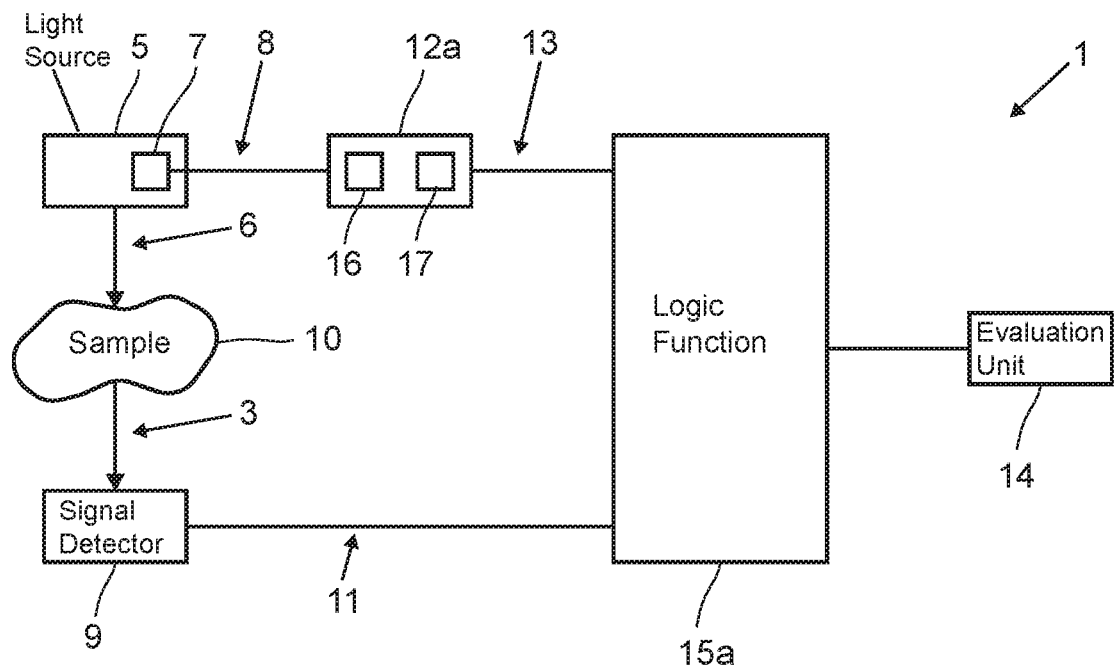
FIG. 1 shows a first embodiment of a measuring device according to the invention.

FIG. 1 shows a measuring device 1 for the time-resolved measurement of a measurement signal 3 and for the temporal separation of at least a first portion 4 of the measurement signal 3, having a light source 5 for emitting a pulsed excitation signal 6, wherein the light source 5 has a trigger 7, which triggers the pulsed excitation signal 6 by means of a trigger signal 8, having at least one detector 9 for receiving the measurement signal 3, wherein the measurement signal 3 is produced by interaction with the sample 10 to be detected, wherein the detector 9 operates continuously in time, and wherein the detector 9 generates a detector signal 11 from the measurement signal 3. In detail, the measuring device 1 is designed to determine the Raman activity of a sample 10.

In addition, the measuring device 1 has a forming unit 12a for generating a first comparison signal 13 and an evaluation unit 14. The first comparison signal 13 correlates with the excitation signal 6. In detail, the comparison signal 13 is derived from the trigger signal 8. The forming unit 12a is designed in such a manner that it delays the trigger signal 8 over time and furthermore shapes the trigger signal 8 in such a manner that it is designed as a positive signal for a time period $t_2$. As a result, the comparison signal 13 is designed such that the positive portion of the comparison signal 13 is synchronized with the first portion 4 of the detector signal 11 to be separated. In addition, a logic function 15a is provided in the form of an AND gate, wherein the logic function 15a links the comparison signal 13 and the detector signal 11. Due to the synchronization of the positive portion of the comparison signal 13 with the first portion 4 of the detector signal 11 to be separated, a signal is forwarded to the evaluation unit 14 which provides a measure for the intensity of the first portion 4 of the detector signal 11. In the embodiment shown, the evaluation unit 14 has a counter which adds up a measure for the intensity of the first portion 4 of the measurement signal, in detail the number of Raman photons that strike the detector during a measurement time having a plurality of measurement cycles. The first portion 4 of the detector signal 11 or the measurement signal 3 can be separated and evaluated particularly easily using the measuring device shown. In detail, it is thus possible to determine only the emission of Raman photons, whereby superposition with fluorescence photons can be avoided.

Figure 2:
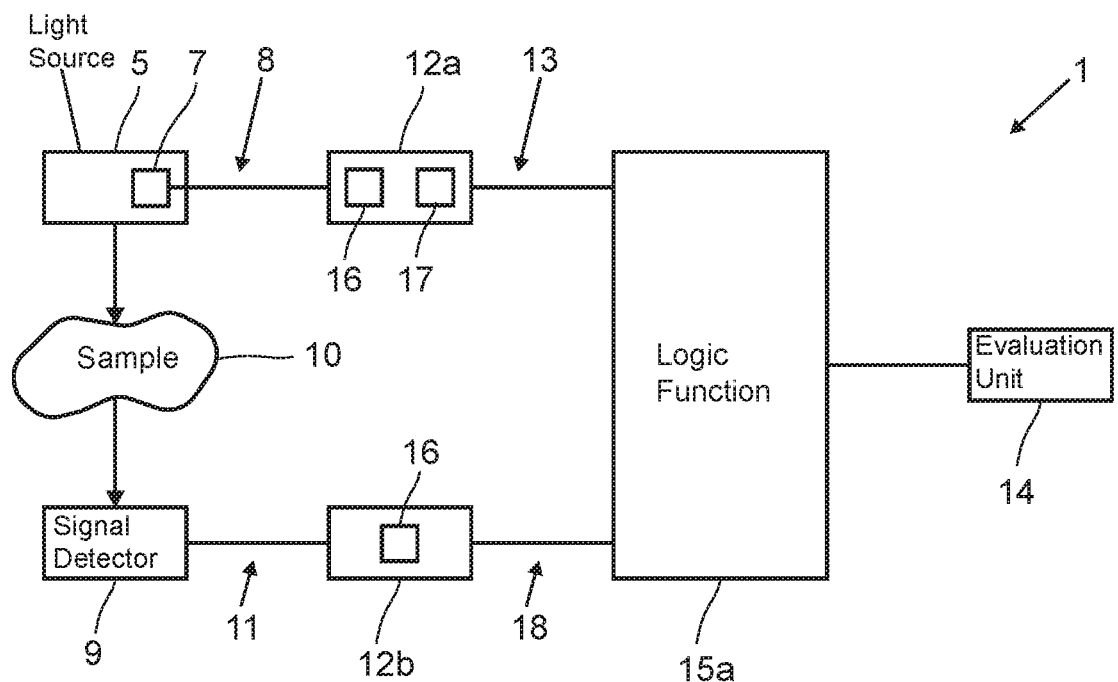
FIG. 2 shows a second embodiment of a measuring device according to invention.

In the embodiment of the measuring device 1 shown in FIG. 2, a second forming unit 12b is additionally provided which is connected to the detector 9, wherein the second forming unit 12b also has a delay element 16, wherein the delay element 16 temporally delays the detector signal 11 such that it temporally correlates with the formed trigger signal 8. A temporal synchronization of the comparison signal 13 and the signal 18 derived from the detector signal 11 can be set particularly precisely according to this design.

Figure 3:
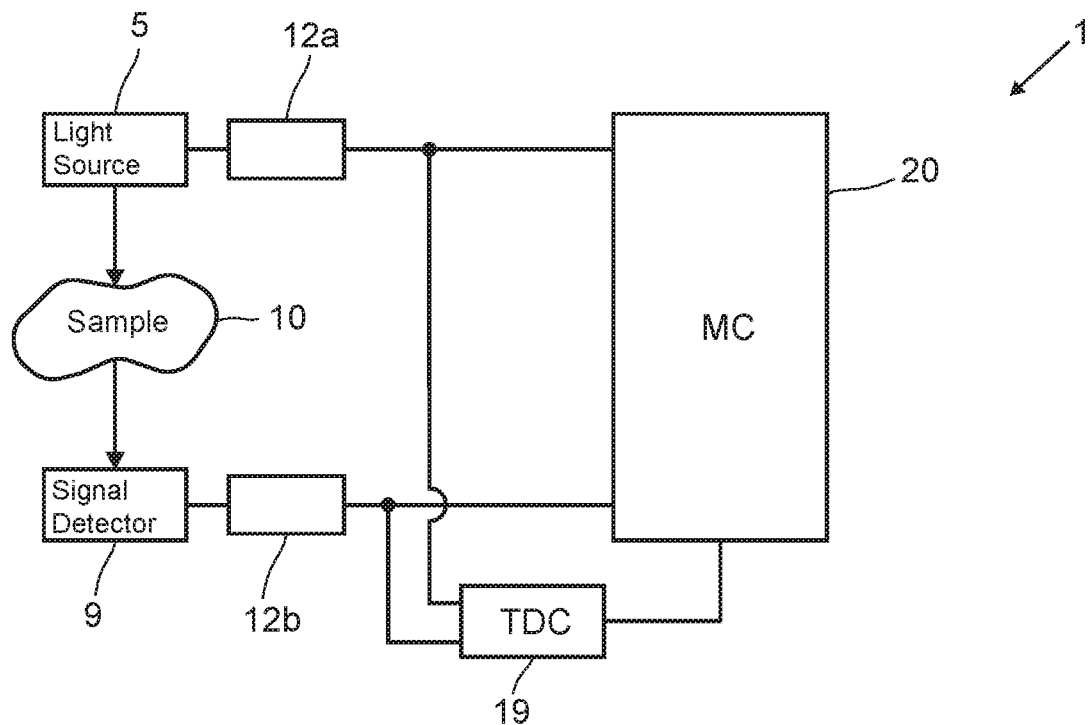
FIG. 3 shows a third embodiment of a measuring device according to invention.

In the third embodiment shown in FIG. 3, the logic function 15a and forming unit 12a are implemented in a microcontroller 20. To determine the time shift between the trigger signal 8 and the first portion 4 of the detector signal 11, a time-to-digital converter (TDC) 19 is provided.

Figure 4:
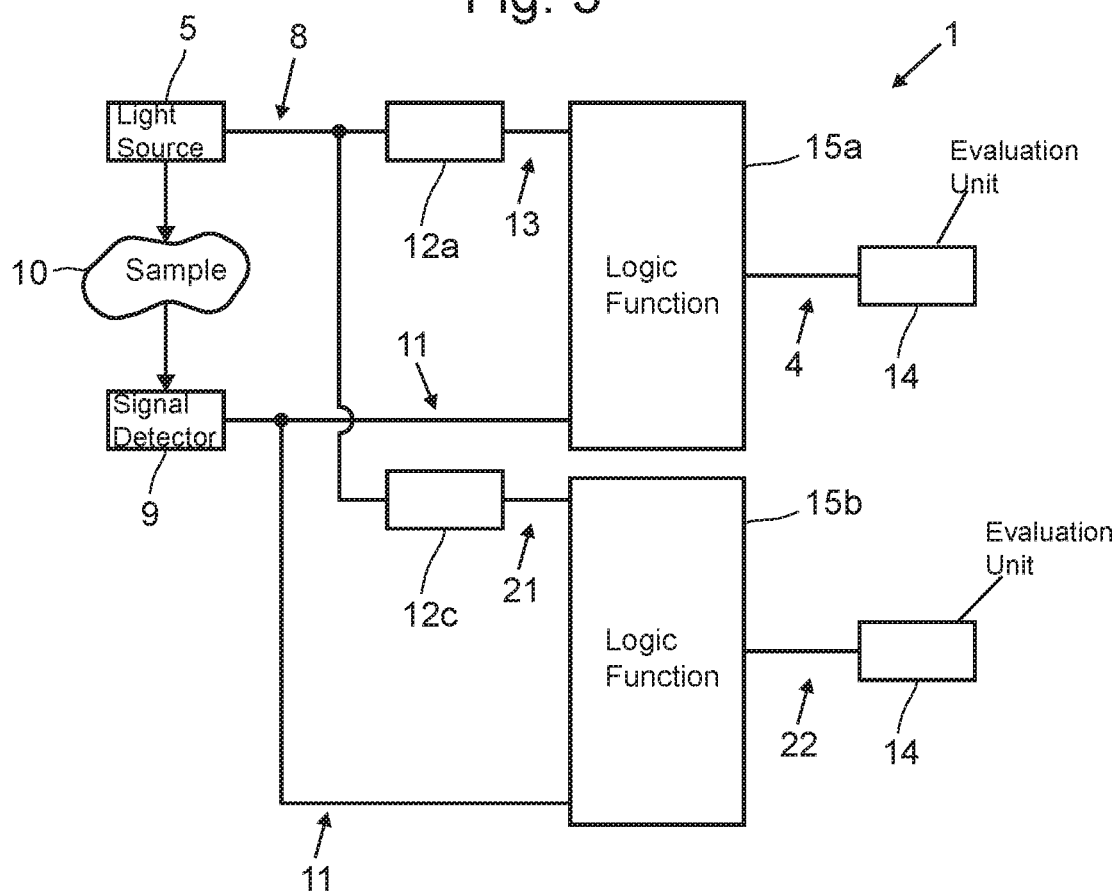
FIG. 4 shows a fourth embodiment of a measuring device according to invention.

In the embodiments shown in FIG. 4, the trigger signal 8 in a first forming unit 12a is formed into a first comparison signal 13, wherein the first comparison signal 13 is synchronized with the first portion 4 of the detector signal 11, so that the first logic function 15a, which is designed as an AND operation, transmits a measure for the intensity of the first signal portion 4 of the detector signal 11 to the evaluation unit 14.

At the same time, the trigger signal 8 is converted into a second comparison signal 21 in a second forming unit 12c, wherein the second comparison signal 21 is synchronized with a second portion 22 of the detector signal 11 and the measurement signal 3, respectively, so that the second logic function 15b, which is also designed as an AND operation here, forwards a measure for the intensity of the second signal portion 22 of the detector signal 11 to the evaluation unit 14. According to this embodiment, several signal portions of a measurement signal 3 or a detector signal 11 can be separated from one another in an advantageous way and thus can be evaluated separately.

Figure 5:
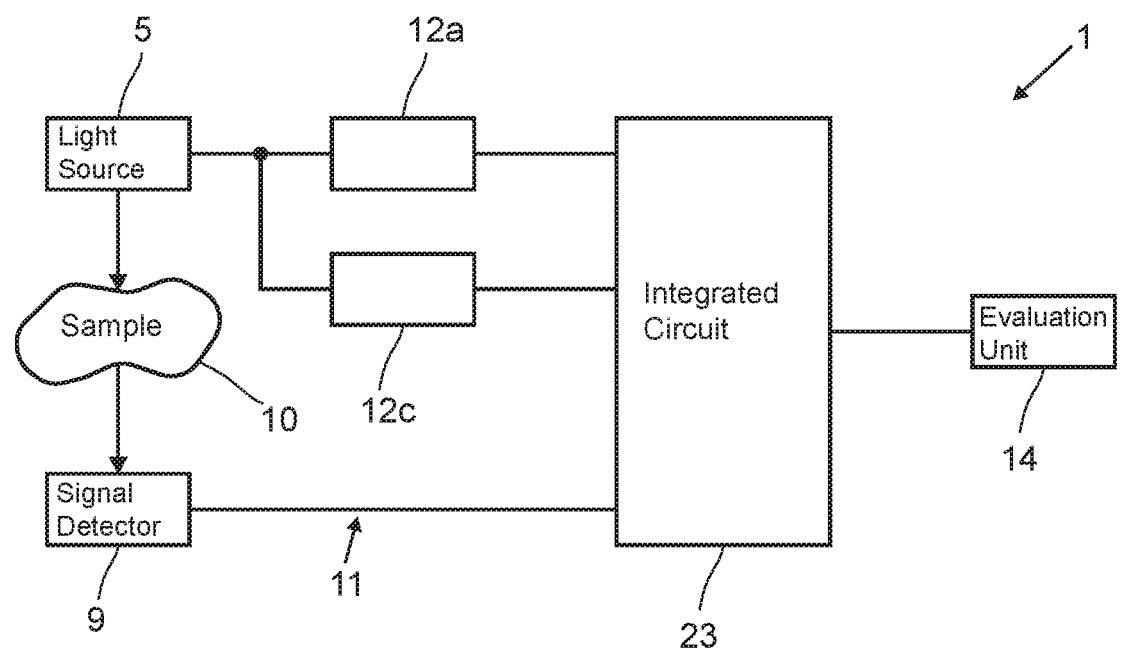
FIG. 5 shows a fifth embodiment of a measuring device according to invention, FIG. 6 schematically illustrates the temporal course of the excitation signal, the comparison signal and various detector signals.

Basically, the various logic functions 15a, 15b can be implemented by separate transistor circuits, alternatively, these functions can also be implemented by an integrated circuit 23, as shown in FIG. 5.

Figure 6:
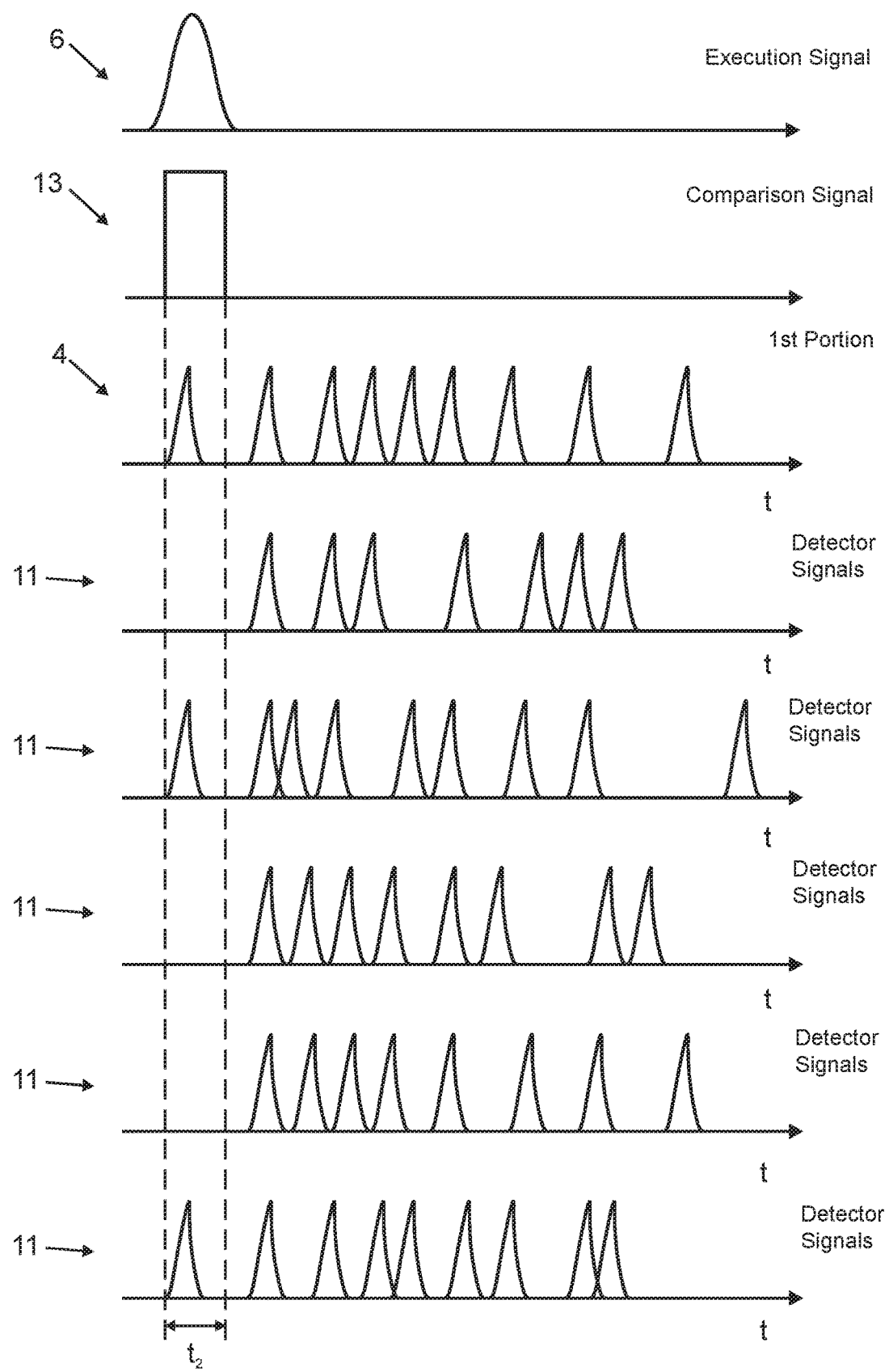

FIG. 6 shows the signal curve of the excitation signal 6, the comparison signal 13 and six consecutive detector signals 11, wherein the comparison signal 13 is designed and adapted in such a manner that the positive portion of the comparison signal 13 is synchronized with the first portion 4 of the detector signal 11 to be separated. In cases 1, 3 and 6, a Raman photon is detected in each case, in the case of the remaining detector signals 2, 4 and 5 no Raman photon is detected in the time period under consideration. In the embodiment shown, the duration $t_2$ of the comparison signal 13 corresponds essentially to the duration of the excitation signal 6, which ensures that only Raman photons and no fluorescence photons are detected, provided that the duration $t_2$ is sufficiently short.

Figure 7:
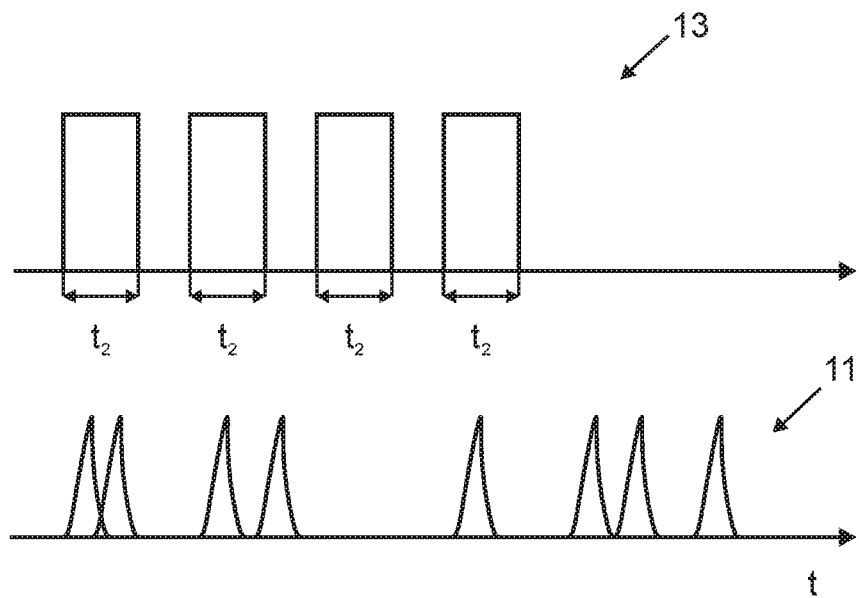
FIG. 7 shows a second example for the temporal course of the comparison signal and the detector signal.

In FIG. 7, the comparison signal 13 has a sequence of positive signal portions, wherein the sequence of positive signal portions is synchronized overall with the first portion 4 of the detector signal 11 to be separated. If, for example, the detector signal 11 is sampled by an AND gate by linking these signals, and if the number of photons measured for each positive portion of the comparison signal 13 is evaluated separately in the evaluation unit, a statement can be made about the intensity curve of the first portion 4 of the detector signal.

Figure 8:
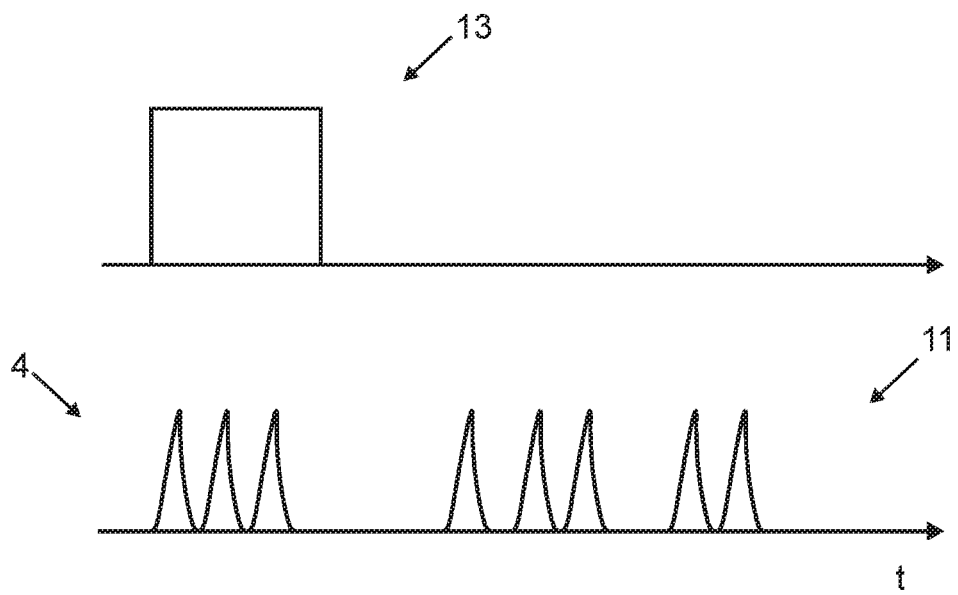
FIG. 8 shows a third example for the temporal course of the comparison signal and the detector signal.

In the embodiment shown in FIG. 8, the excitation signal 6 is designed in such a manner that a plurality of Raman photons are emitted immediately, so that the portion 4 of the measurement signal 3 to be separated has a plurality of Raman photons, wherein the duration $t_2$ of the positive portion of the comparison signal 13 corresponds to the duration of the Raman photons to be detected.

Figure 9:
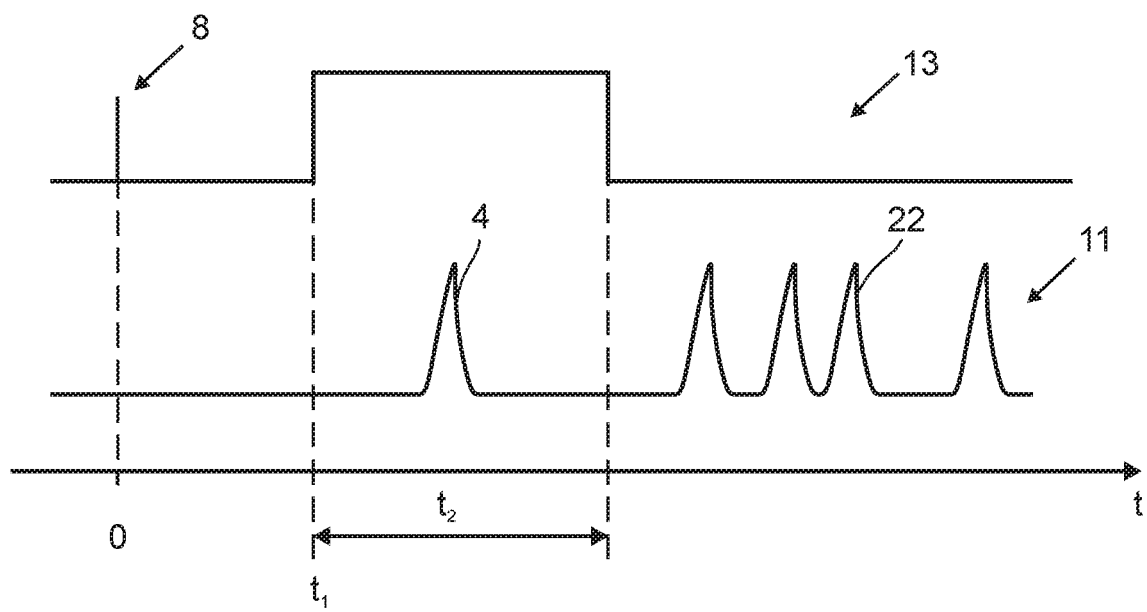
FIG. 9 shows a fourth example for the temporal course of the comparison signal and the detector signal.

In contrast, the comparison signal 13 in FIG. 9 is designed such that, after the trigger signal 8, a positive signal is implemented for a time period $t_2$ at a time difference $t_1$, where $t_2$ essentially corresponds to the time period of the signal portion 4 of the detector signal 11 to be separated.

Figure 10:
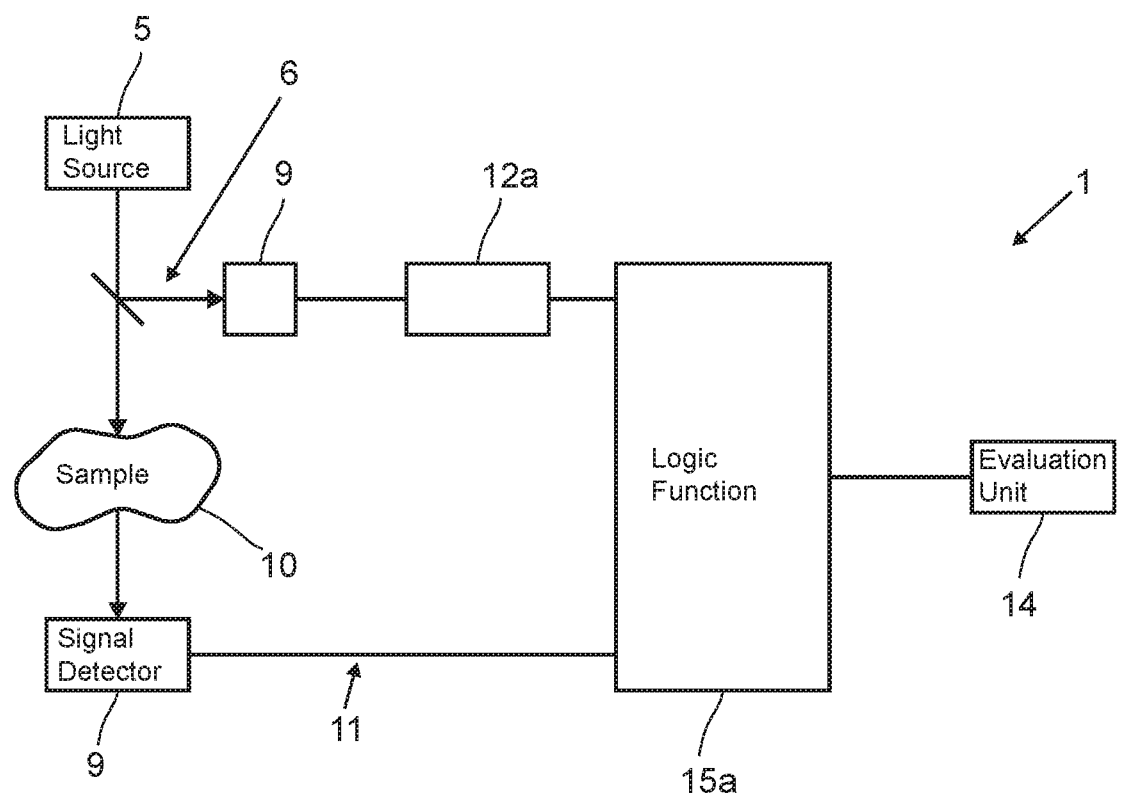
FIG. 10 shows a sixth example of a measuring device according to invention.

FIG. 10 shows a next embodiment of a measuring device 1, wherein, in contrast to the previously described embodiments, a second detector 9 is provided, which directly detects the excitation signal 6, i.e., without prior interaction with the sample, and transmits it to the forming unit 12a.

According to this embodiment, the comparison signal 13 is derived from the excitation signal 6 and not from the trigger signal 8.

Figure 11:
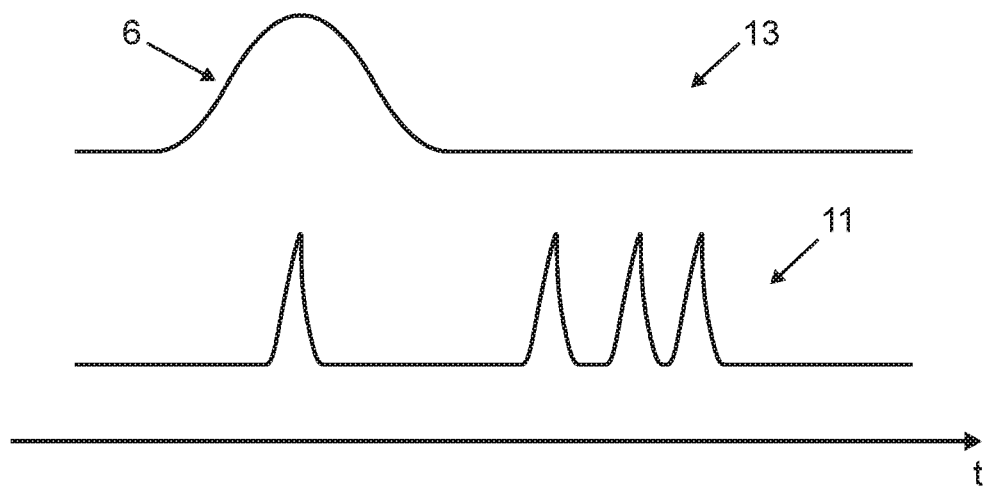
FIG. 11 shows schematic representation of the temporal course of the comparison signal and the detector signal of the embodiment shown in FIG. 10.

FIG. 11 shows the temporal course of the comparison signal 13 derived from the excitation signal 6 and the detector signal 11. According to the embodiment shown, the excitation signal 6 is time-delayed and shaped by the forming unit 12a in such a manner that the excitation signal 6 correlates temporally with the first portion 4 of the detector signal 11.

Figure 12:
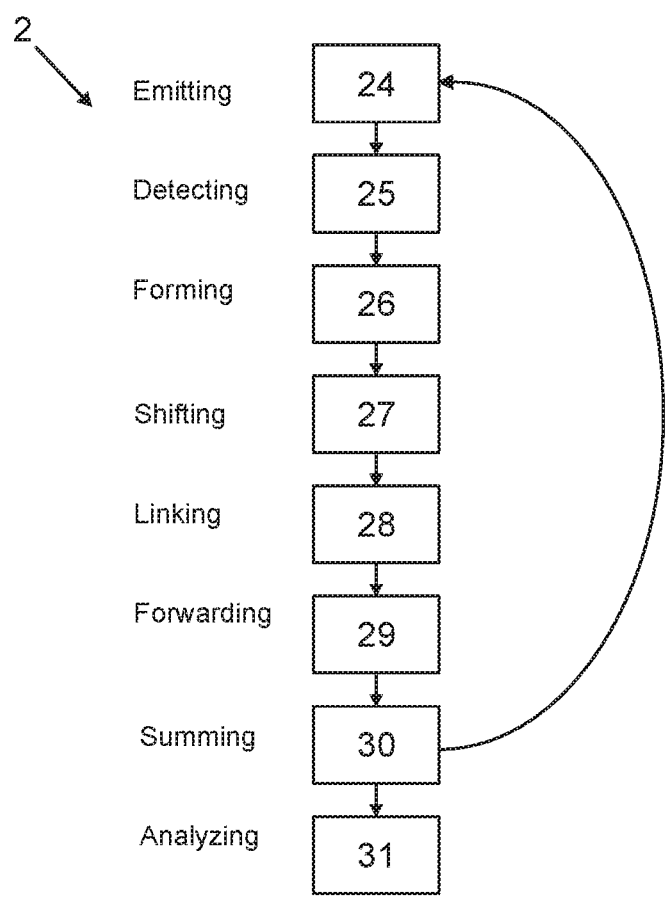
FIG. 12 shows a first embodiment of a method according to the invention.

FIG. 12 shows a first embodiment of a method 2 according to invention, wherein the measuring device 1 is designed according to FIG. 1. The method 2 according to the invention comprises the following steps in each measuring cycle:

emitting 24 a pulsed excitation signal 6 by the light source 5, interacting of the excitation signal 6 with the sample 10, detecting and converting 25 of the measurement signal 3 into a detector signal 11 by the detector 9, forming 26 and shifting 27 the trigger signal 8 in the forming unit 12 and generating the comparison signal 13, linking 28 the comparison signal 13 and the detector signal 11 in the logic function 15a to separate the first portion 4 of the measurement signal 3, and forwarding and evaluating 29 by the evaluation unit 14 of the output of the logic function 15a, wherein the evaluation comprises determining the number of photons that strike the detector 9 during the period of time of the portion of the measurement signal 3 to be separated.

Steps 25 to 27 shown in the embodiment take place essentially simultaneously.

According to the embodiment shown, the method completes several measuring cycles with steps 24 to 30 during one measuring time. During the measuring time, the evaluation unit sums 30 the number of photons measured per measuring cycle to a total number. According to the example shown, the method comprises several measuring times. The evaluation unit then determines the Raman activity of the sample based on a statistical evaluation 31 including, for example, averaging the total numbers determined during the various measurement times.

What is claimed is:

1. A measuring device for time-resolved measurement of a measurement signal and for temporal separation of at least a first portion of the measurement signal, comprising:

a light source for emitting a pulsed excitation signal, at least one detector for receiving the measurement signal and generating a detector signal from the measurement signal, at least one first forming unit for generating a first comparison signal, and at least one evaluation unit, wherein the first comparison signal correlates with the excitation signal, wherein at least one first logic function is provided, the first logic function, during operation, linking at least the first comparison signal and a signal dependent on the detector signal to one another in such a manner that the output of the logic function provides a measure for the intensity of the first portion of the measurement signal or of the detector signal, wherein the number of photons that strike the detector during the time period of the portion of the measurement signal which is to be separated indicates the intensity of a portion of the measurement signal, wherein the first logic function provides an output to the at least one evaluation unit, and wherein at least one further forming unit is provided for generating a second comparison signal, wherein the second comparison signal correlates with the excitation signal, wherein at least one second logic function is provided, wherein the second logic function links the second comparison signal and a signal dependent on the detector signal in such a manner that the output of the logic function provides a measure for the intensity of a second portion of the measurement signal, and wherein the output of the second logic function is connected to the at least one evaluation unit.

2. The measuring device according to claim 1, wherein the correlation between the first comparison signal and the excitation signal is obtained by deriving the first comparison signal from the excitation signal.

3. The measuring device according to claim 1, wherein the light source has a trigger, wherein the trigger triggers the pulsed excitation signal by means of a trigger signal, and wherein the correlation between the first comparison signal and the excitation signal is obtained by deriving the first comparison signal from the trigger signal.

4. The measuring device according to claim 1, wherein the forming unit has at least one delay unit, wherein the delay unit, during operation, temporally synchronizes the pulsed excitation signal or the trigger signal with the signal dependent on the detector signal.

5. The measuring device according to claim 1, wherein the forming unit has at least one means for generating at least one positive signal for a time period $t_2$ at a time difference of $t_1 \geq 0$ from the excitation signal or the trigger signal.

6. The measuring device according to claim 1, wherein the forming unit has at least one means for temporal stretching and/or temporal compression of the excitation signal or the trigger signal.

7. The measuring device according to claim 1, wherein at least one further forming unit is connected to the outlet of the detector, wherein the further forming unit has a delay unit that temporally synchronizes the first portion of the detector signal with the excitation signal or the trigger signal.

8. The measuring device according to claim 1, wherein the logic function comprises at least one AND operation, OR operation, XOR operation, NAND operation, NOR operation or XNOR operation.

9. The measuring device according to claim 1, wherein a time-to-digital converter is provided for determining a time offset between the excitation signal or the trigger signal and the first portion of the detector signal.

10. The measuring device according to claim 1, wherein the at least one logic function and/or the at least one forming unit are implemented in a microcontroller.

11. The measuring device according to claim 1, wherein the at least one logic function comprises a logic gate.

12. The measuring device according to claim 1, wherein the evaluation unit comprises at least one counter.

13. A method for time-resolved measurement of a measurement signal and for temporal separation of at least a first portion of the measurement signal using a measuring device having a light source for emitting a pulsed excitation signal, at least one detector for receiving the measurement signal and generating a detector signal from the measurement signal, at least one forming unit for generating a first comparison signal, and at least one evaluation unit, the method comprising:
  correlating the first comparison signal with the excitation signal,
  using a first logic function to link the first comparison signal and a signal dependent on the detector signal,
  connecting an output of the first logic function to the at least one evaluation unit, and
the following being performed in a measurement cycle:
  emitting a pulsed excitation signal by the light source,
  interacting of the excitation signal with the sample,
  detecting and converting the measurement signal into a detector signal by the detector,
  generating the comparison signal in the forming unit,
  linking the comparison signal with a signal dependent on the detector signal in the logic function for separating the first portion of the measurement signal,
  forwarding and evaluating of the output of the logic function with the evaluation unit, the evaluation determining the number of photons that strike the detector during the period of time of the portion of the measurement signal to be separated,
  providing at least one further forming unit and generating a second comparison signal which correlates with the excitation signal,
  providing at least one second logic function and linking the second comparison signal and a signal dependent on the detector signal in such a manner that the output of the logic function provides a measure for the intensity of a second portion of the measurement signal, and
  connecting the output of the second logic function to the at least one evaluation unit.

* * * * *